(12) United States Patent
Frey et al.

(10) Patent No.: US 8,755,214 B2
(45) Date of Patent: Jun. 17, 2014

(54) DETERMINING CELL-STATE IN PHASE-CHANGE MEMORY

(75) Inventors: Urs Frey, Zurich (CH); Angeliki Pantazi, Zurich (CH); Nikolaos Papandreou, Zurich (CH); Charalampos Pozidis, Zurich (CH); Abu Sebastian, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 13/415,012

(22) Filed: Mar. 8, 2012

(65) Prior Publication Data

US 2012/0230097 A1 Sep. 13, 2012

(30) Foreign Application Priority Data

Mar. 10, 2011 (EP) .................................... 11157698

(51) Int. Cl.
G11C 13/00 (2006.01)
(52) U.S. Cl.
CPC ........ G11C 13/0004 (2013.01); G11C 13/0069 (2013.01)
USPC ........................................................ 365/148
(58) Field of Classification Search
CPC .............................................. G11C 13/0004
USPC ........................................................ 365/148
See application file for complete search history.

(56) References Cited

U.S. PATENT DOCUMENTS

| | | | |
|---|---|---|---|
| 7,247,547 B2 | 7/2007 | Zhu et al. | |
| 7,505,334 B1 | 3/2009 | Breitwisch | |
| 7,573,775 B2 | 8/2009 | Fallah | |
| 7,646,633 B2 | 1/2010 | Fuji | |
| 7,986,549 B1 * | 7/2011 | Tang et al. | ..................... 365/163 |
| 2003/0043631 A1 * | 3/2003 | Gilton et al. | ............. 365/185.28 |
| 2006/0023497 A1 | 2/2006 | Kawazoe et al. | |
| 2010/0259993 A1 * | 10/2010 | Kang | ....................... 365/185.22 |
| 2011/0051497 A1 | 3/2011 | Kim | |
| 2012/0069633 A1 | 3/2012 | Katoh | |
| 2013/0063997 A1 * | 3/2013 | Maislos | ......................... 365/45 |

FOREIGN PATENT DOCUMENTS

| | | |
|---|---|---|
| CN | 1628357 A | 6/2005 |
| CN | 1747058 A | 3/2006 |
| CN | 101236779 A | 8/2008 |
| KR | 100895400 B1 | 6/2009 |

OTHER PUBLICATIONS

Patent Cooperation Treaty, "Notification of Transmittal of the International Search Report and the Written Opinion of the International Searching Authority, or the Declaration" Issued for PCT/IB2012/050848 on Jul. 12, 2012. (9 Pages).
Frey, U., et al. "Determining Cell-State in Phase-Change Memory". Non Final Office Action for U.S. Appl. No. 13/573,000 mailed on Oct. 24, 2013. (13 Pages).
Bhaskaran, H. et al. "Method of Fabricating a Semiconductor Device" Final Office Action for U.S. Appl. No. 13/083,057 as mail on Aug. 21, 2013. (12 Pages).

* cited by examiner

*Primary Examiner* — Huan Hoang
*Assistant Examiner* — Min Huang
(74) *Attorney, Agent, or Firm* — Tutunjian & Bitetto, P.C.; Jennifer R. Davis

(57) ABSTRACT

A method, an apparatus, and a device for determining the state of a phase-change memory cell. The method includes the steps of: biasing a cell with a time-varying read voltage ($V_{read}$); making a measurement ($T_M$) that satisfies a predetermined condition where the predetermined condition depends on a cell current when the read voltage is applied; and determining a state of the cell based on the measurement.

15 Claims, 11 Drawing Sheets

DETERMINING CELL-STATE IN PHASE-CHANGE MEMORY

CROSS-REFERENCE TO RELATED APPLICATION

This application claims priority under 35 U.S.C. §119 from European Patent Application No. 11157698.9 filed Mar. 10, 2011. This application is related to the commonly owned U.S. patent application Ser. No. 13/415,061 entitled "PROGRAMMING OF PHASE-CHANGE MEMORY CELLS" and the commonly owned U.S. patent application Ser. No. 13/415,127 entitled "CELL-STATE MEASUREMENT IN RESISTIVE MEMORY" both of which were filed concurrent with the present application on Mar. 8, 2012. The entire contents of all of the aforementioned applications are incorporated herein by reference.

BACKGROUND OF THE INVENTION

1. Field of the Invention

This invention relates generally to phase-change memory. More particularly, this present invention relates to methods and apparatus for determining the state of phase-change memory cells.

2. Description of Related Art

Phase-change memory (PCM) is a new, non-volatile solid-state memory technology that exploits the reversible switching of certain chalcogenide materials having at least two states with different electrical conductivity. PCM is fast, has good retention and endurance properties, and has been shown to scale to the future lithography nodes.

In single-level cell (SLC) PCM devices, the fundamental storage unit (the "cell") can store one bit of binary information. The cell can be set to one state out of two states, which include crystalline and amorphous, by application of heat. In the amorphous state, which represents binary 0, the electrical resistance of the cell is high. When heated to a temperature above its crystallization point and then cooled, the chalcogenide material is transformed into an electrically-conductive crystalline state. This low-resistance state represents binary 1. If the cell is then heated to a high temperature, above the chalcogenide melting point, the chalcogenide material reverts back to its amorphous state on rapid cooling.

In multilevel-cell (MLC) PCM devices, a memory cell can be set to s different states, where s>2, in order to permit storage of more than one bit per cell. MLC operation is achieved by exploiting partially-amorphous states of the PCM cell. Different cell states are set by varying the size of the amorphous region within the chalcogenide material. This varies cell resistance. Thus, each cell state corresponds to a different amorphous volume which in turn corresponds to a different resistance level.

To write data to a PCM cell, a voltage or current pulse is applied to the cell to heat the chalcogenide material to an appropriate temperature to induce the desired cell-state on cooling. Reading of PCM cells is performed using cell resistance as a metric for cell-state.

The resistance of a cell can be measured in various ways, usually by biasing the cell at a certain constant voltage level and measuring the current that flows through it. U.S. Pat. No. 7,505,334 B1 discloses an alternative method whereby cell resistance is detected from the discharge time of an RC (resistor-capacitor) circuit in which the cell is the resistor. However measured, the resulting resistance indicates cell-state according to the predefined correspondence between resistance levels and cell-states.

The resistance measurement for a read operation is performed in the sub-threshold region of the current-versus-voltage (I/V) characteristic of the cell, i.e. in the region below the threshold switching voltage at which a change in cell-state can occur. Since the threshold switching occurs at a fixed electric field, the states which correspond to low amorphous size undergo threshold switching at lower bias voltages. A low, and hence safe, bias voltage is therefore used for reading all cells. In this low-field region, all cells can be read without affecting cell-state.

SUMMARY OF THE INVENTION

Accordingly, one aspect of the present invention provides a method for determining the state of a phase-change memory cell, the method including the steps of: biasing a cell with a time-varying read voltage ($V_{read}$); making a measurement ($T_M$) that satisfies a predetermined condition, where the predetermined condition depends on a cell current when the read voltage is applied; and determining a state of the cell based on the measurement.

Another aspect of the present invention provides an apparatus for determining the state of a phase-change memory cell, the apparatus including: a measurement circuit for: (i) biasing a cell with a time-varying read voltage ($V_{read}$); and (ii) making a measurement ($T_M$) that satisfies a predetermined condition, where the condition depends on a cell current when the read voltage is applied; and a controller for determining a state of the cell based on the measurement.

Another aspect of the present invention provides a phase-change memory device including:

memory including a plurality of phase-change memory cells; and read/write apparatus for reading and writing data in phase-change memory cells, where the read/write apparatus includes:

a measurement circuit for:

(i) biasing a cell with a time-varying read voltage ($V_{read}$); and (ii) making a measurement ($T_M$) that satisfies a predetermined condition, where the condition depends on a cell current when the read voltage is applied; and where a controller for determining a state of the cell based on the measurement.

DETAILED DESCRIPTION OF THE PREFERRED EMBODIMENTS

Figure 1:
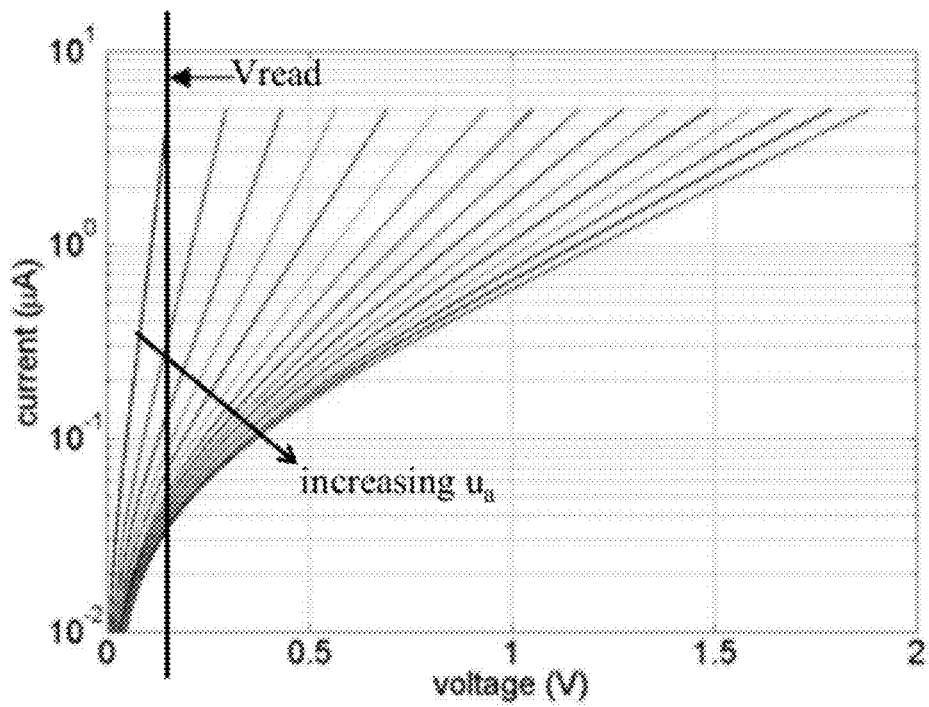
FIG. 1 illustrates simulated I/V characteristics for different resistance levels of a PCM cell.

In general, where features are described herein with reference to a method embodying the invention, corresponding features can be provided in an apparatus or device embodying the invention, and vice versa.

An embodiment of a first aspect of the present invention provides a method for determining the state of a phase-change memory cell. The method includes:

biasing the cell with a time-varying read voltage;

making a measurement dependent on a predetermined condition, which condition is dependent on cell current during application of the read voltage, being satisfied; and determining the state of the cell in dependence on the measurement.

In embodiments of this invention, instead of applying a constant read voltage, the cell can be biased with a read voltage which varies with time. During application of this time-varying read voltage, a measurement is made. This measurement is dependent on a predetermined condition, which depends on the current flowing through the cell, being satisfied. For example, in some embodiments the measurement is indicative of the read voltage level at which the current-dependent condition is satisfied. In other embodiments, the measurement is indicative of the time taken for the current-dependent condition to be satisfied. In any case, the resulting measurement can then be used to determine cell-state. As the read voltage varies in embodiments of the invention, the cell current varies accordingly in dependence on the I/V characteristic for the cell state in question. By obtaining a measurement which is dependent on the cell current satisfying a predetermined condition, methods embodying the invention can exploit differences in form of the I/V characteristic for different cell states in a effective manner. The resulting measurement provides a good metric for amorphous size (the fundamental programmed entity) and hence for cell-state. The metric can be used to probe the high field region of cell operation and can effectively distinguish states with high amorphous fractions. This can increase the available programming space, allowing operation with more levels and hence storage of more bits per cell. The metric can also offer the prospect of MLC operation with improved tolerance to drift and low frequency noise.

In some preferred embodiments the form of the read voltage is predetermined. In particular, in these embodiments the cell is biased with a predetermined read voltage which varies with time over a range of voltage levels. With such a predetermined read voltage, the measurement that is made can be indicative of the time taken for the predetermined condition to be satisfied. This provides a time-based metric for determining cell-state. Embodiments can be envisaged, however, in which the read voltage does not vary with time in a predetermined manner. In these embodiments, the measurement that is made can be indicative of the read voltage level at which the predetermined condition is satisfied. As an example, the read voltage level can be varied in a substantially random manner until the current-dependent condition is determined to be satisfied, the read voltage level at which this occurs being measured in this case. This will be discussed further below.

In general, the read voltage can vary in an analog or a digital manner. In embodiments employing a predetermined read voltage, the read voltage preferably increases with time. In particular, according to embodiments of the invention the read voltage generally increases with increasing time and, according to further embodiments, the read voltage increases monotonically with time. The read voltage can be a linear function of time, or a non-linear function of time, and examples of both cases will be discussed below. While the way in which the read voltage varies with time can be predetermined for the read operation, the duration of application of the read voltage can differ for different read operations. In particular, preferred embodiments include ceasing application of the read voltage when the predetermined condition is satisfied. The duration of the read voltage can therefore vary for different measurements. This can not only increase read bandwidth, it also can enable probing of a higher field region of cell operation without danger of disturbing states (level switching). In particular, the detection condition discussed further below can be set so that the read voltage range can traverse threshold switching voltages for at least some of the lower levels while still avoiding level switching.

In embodiments employing a time-based metric, the measurement indicative of time can be made in various ways and can directly or indirectly indicate the time in question. Some embodiments can measure time itself in some manner. Other embodiments can measure some other parameter indicative of time. For example, where the predetermined read voltage is a linear function of time, the read voltage level at which the predetermined condition is satisfied can be measured as a time indicator. In embodiments where the read voltage is not predetermined, the measurement indicative of read voltage level can similarly measure read voltage per se or any convenient parameter indicative thereof.

The predetermined condition can depend on cell current in a variety of ways. The condition can be that the cell current reaches a predetermined current level (in particular that it equals or traverses a predetermined detection threshold). As another example, when the form of the read voltage is predetermined, the condition can be that the cell current changes from a first predetermined current level to a second predetermined current level. A predetermined current level employed in these examples can or can not be a function of the read voltage. Where such a current level is a function read voltage, various functions having increasing and/or decreasing profile portions across the read voltage range can be employed. Examples of these and other embodiments will be described below.

Having obtained the time or voltage level measurement, the particular way in which cell state is determined using this measurement can vary in different embodiments. This step can use the basic measurement as the cell-state metric, or can derive the final metric by processing the measurement in some way. Possible examples here include some form of averaging process or further processing based on techniques which can be employed in addition to the basic measurement method, e.g. any additional corrective techniques to further enhance read accuracy. In preferred embodiments, the cell-state can be determined by comparing a metric dependent on the measurement with one or more reference values indicative of the different cell-states. Embodiments of the invention can be applied to two-level PCM cells as well as to multilevel cells. When applied for determining the state of a multilevel cell (i.e. an s-level cell, where s>2), preferred methods can include determining the state of the cell by comparing a metric dependent on the measurement with a plurality of reference values indicative of the s levels of the cell. The metric here can be the measurement per se or some other metric obtained by processing the measurement as indicated above. The reference values can define cell levels in a variety of ways, e.g. in terms of predetermined threshold values defining boundaries for measurement ranges which map to the different cell states.

An embodiment of a second aspect of the invention provides apparatus for determining the state of a phase-change memory cell. The apparatus includes:

a measurement circuit for biasing the cell with a time-varying read voltage and for making a measurement dependent on a predetermined condition, which condition is dependent on cell current during application of the read voltage, being satisfied; and a controller for determining the state of the cell in dependence on the measurement.

According to an embodiment of another aspect of the present invention, a phase-change memory device is provides:

memory including a plurality of phase-change memory cells; and read/write apparatus for reading and writing data in the phase-change memory cells, where the read/write apparatus includes apparatus according to the second aspect of the invention for determining the state of a the memory cell.

FIG. 1 of the accompanying drawings shows simulated I/V characteristics for sixteen different resistance levels (cell states) based on measurement data obtained from PCM cells. The arrow indicates increasing thickness (ua) of the amorphous phase, and the vertical line indicates a typical bias voltage, Vread, for measuring low-field resistance on readback.

The I/V curves of the low-field resistance technique tend to merge at low fields as amorphous thickness increases. In other words, the low-field resistance tends to saturate with increasing amorphous size. This phenomenon, which is due to cell geometry effects, serves to mask increasing size of the amorphous region when using the resistance metric to determine cell state.

Figure 2:
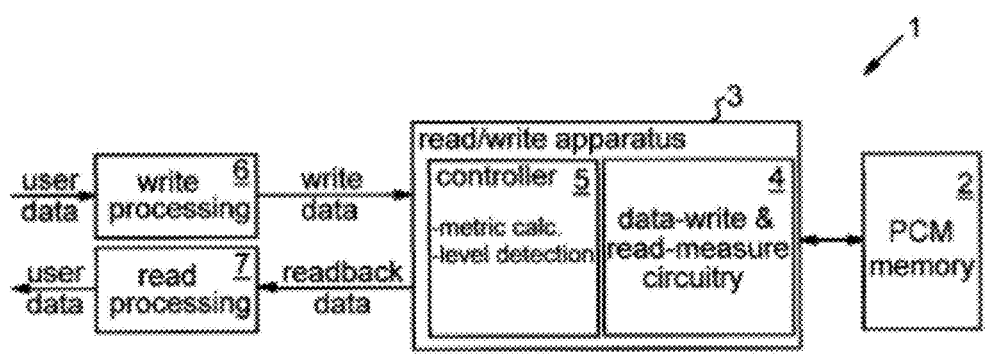
FIG. 2 is a schematic block diagram of a phase-change memory device according to an embodiment of the present invention.

FIG. 2 is a simplified schematic of a phase-change memory device embodying the invention. The device 1 includes phase-change memory 2 for storing data in one or more integrated arrays of multilevel PCM cells. Though shown as a single block in the figure, in general memory 2 can include any desired configuration of PCM storage units ranging, for example, from a single chip or die to a plurality of storage banks each containing multiple packages of storage chips. Reading and writing of data to memory 2 is performed by read/write apparatus 3. Apparatus 3 includes data-write and read-measurement circuitry 4 for writing data to the PCM cells and for making cell measurements allowing determination of cell-state and hence readback of stored data. Circuitry 4 can address individual PCM cells for write and read purposes by applying appropriate voltage signals to an array of word and bit lines in memory ensemble 2. This process can be performed in generally known manner except as detailed hereinafter. A read/write controller 5 controls operation of apparatus 3 generally and includes functionality for determining cell-state, i.e. level detection, based on measurements made by circuitry 4. In general, the functionality of controller 5 can be implemented in hardware or software or a combination thereof, though use of hardwired logic circuits is generally preferred for reasons of operating speed. Suitable implementations will be apparent to those skilled in the art from the description herein. As indicated by block 6 in the figure, user data input to device 1 is typically subjected to some form of write-processing, such as coding for error-correction purposes, before being supplied as write data to read/write apparatus 3. Similarly, readback data output by apparatus 3 is generally processed by a read-processing module 7, e.g. performing codeword detection and error correction operations, to recover the original input user data. Such processing by modules 6 and 7 is independent of the cell-state metric system to be described and need not be discussed in detail here.

Figure 3:
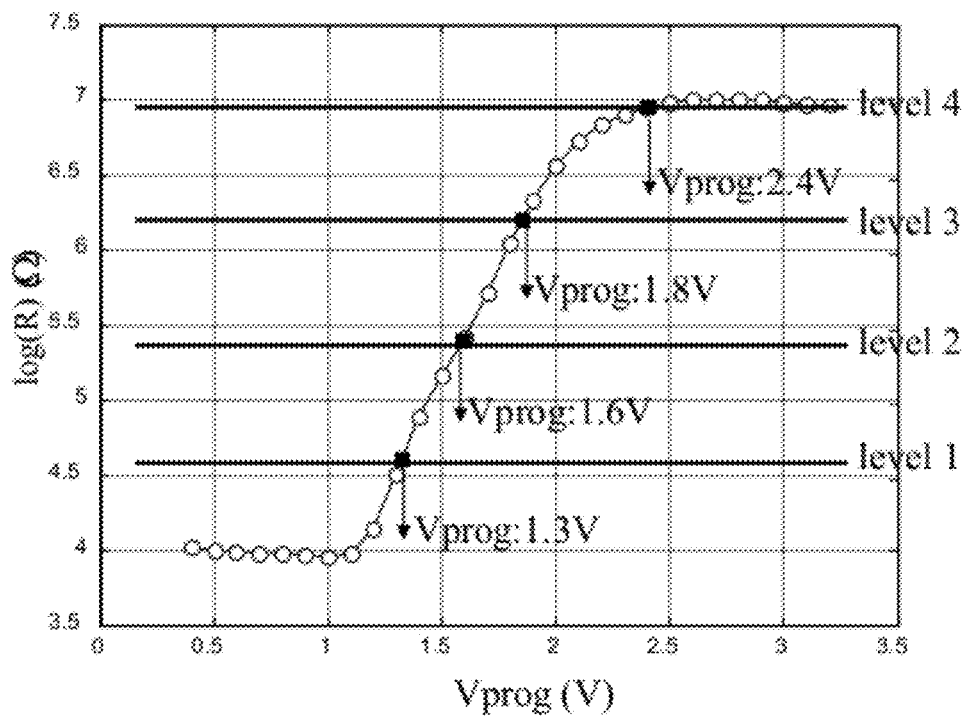
FIG. 3 shows an average programming curve for four-level PCM cells.

Each of the multilevel cells in memory 2 can be set to one of s resistance levels, where s>2, corresponding to different amorphous/crystalline states of the cell. The resistance values corresponding to the different levels are usually unequally-spaced, typically lying in the log domain. To write data to a given cell, circuitry 4 applies a voltage pulse to set the cell to the state corresponding to the appropriate level. FIG. 3 illustrates how cell resistance varies with applied voltage for PCM cells. This figure shows an average programming curve (starting from the "set" state (state of maximum crystallization)) for an array of PCM cells as the logarithm of (average) cell resistance R obtained for applied voltage pulses of increasing amplitude $V_{prog}$. As the applied voltage is increased, increasing melting of the chalcogenide material results in increased size of the amorphous phase within the cell. This in turn causes the programmed resistance to increase along the curve shown. The resistance levels corresponding to different programmable cell-states are predefined for MLC operation. By way of example, four levels are indicated by the horizontal lines in this figure, together with the associated write-pulse amplitudes $V_{prog}$, such as can be defined for four-level PCM operation providing two bits of storage per cell.

Figure 4:
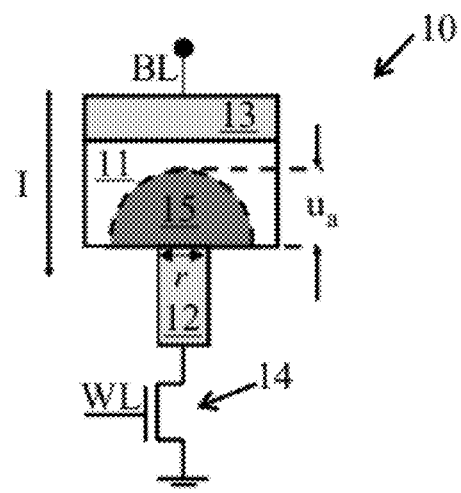
FIG. 4 is a schematic illustration of a PCM cell.

Reading a memory cell involves determining the state of the cell, i.e. detecting which of the predefined levels the cell is set to. The device 1 of FIG. 2 employs a method for determining cell-state based on an improved metric for the fundamental programmed entity, namely amorphous size, in PCM cells. FIG. 4 is a schematic illustration of a typical PCM cell 10. The cell consists of a layer 11 of phase change material, e.g. Germanium Antimony Telluride (GST), sandwiched between a bottom electrode 12 and a top electrode 13. Top electrode 13 is connected to a bit line BL of the memory cell array. The bottom electrode 12 has a radius r of approximately 20 nm and is produced using sub-lithographic means. A transistor 14 is typically used as the access device, the gate contact of this transistor being connected to a word line WL of the array. The amorphous region 15 can be created within the crystalline GST as described earlier by application of a voltage pulse at the bit line BL or the word line WL. When the pulse is applied at the bit line, the technique is known as voltage-mode programming and the transistor serves as a selection device. When the pulse is applied at the word line, the technique is known as current-mode programming and the transistor acts as a voltage controlled current source. The size of the resulting amorphous region, indicated in the figure by amorphous thickness $u_a$, depends on the amplitude of the programming pulse as already described. In a read operation of the FIG. 2 device, a measurement is performed which provides a metric for this amorphous size, and hence for cell-state. The read operation will now be described with reference to FIGS. 5 to 7b.

Figure 5:
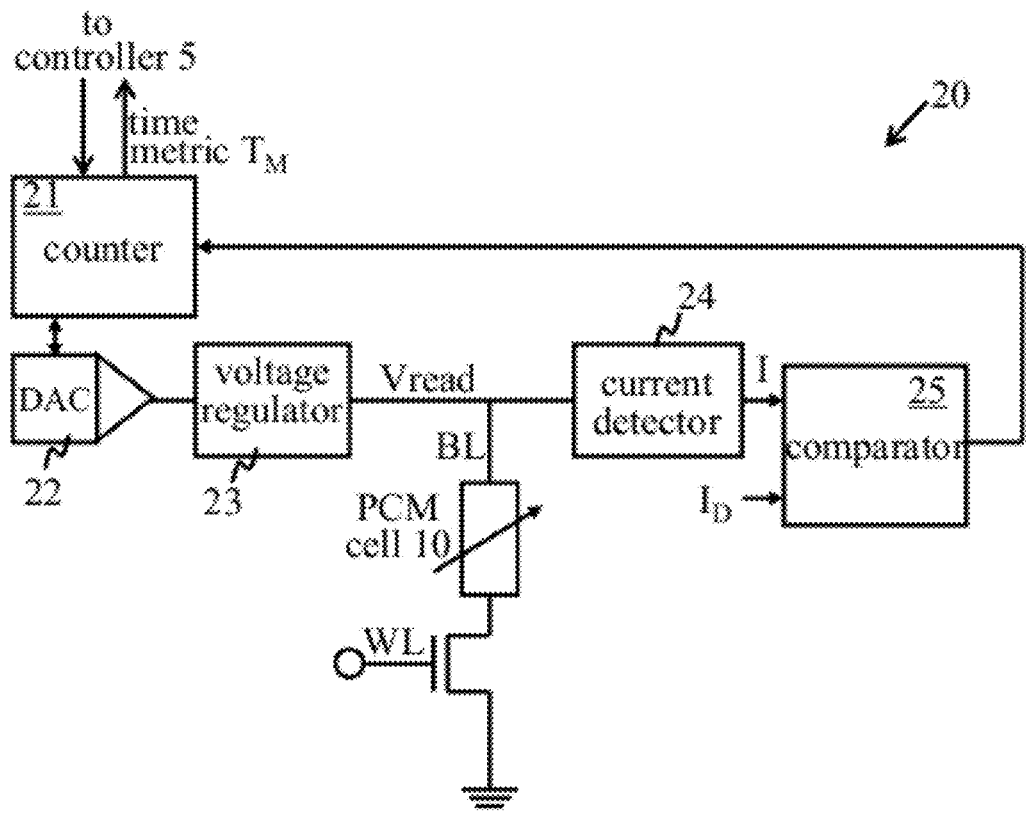
FIG. 5 is a schematic block diagram of a read measurement circuit of the FIG. 2 device.
Figure 6:
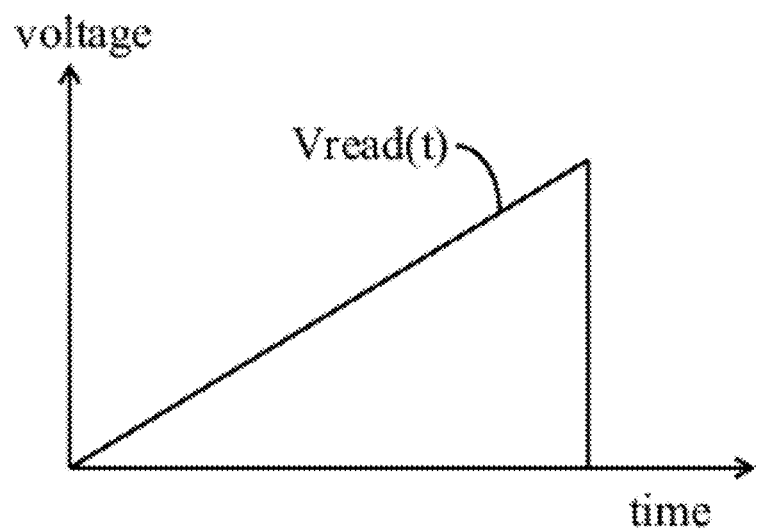
FIG. 6 illustrates a bias voltage used in the read measurement circuit of FIG. 5.

FIG. 5 is a schematic block diagram of an exemplary read measurement circuit 20 for use in circuitry 4 of the memory device 1. The measurement circuit 20 includes a counter 21, a digital-to-analog converter (DAC) 22, a voltage regulator 23, a current detector 24 and a comparator 25 connected as shown in the figure. These circuit components can be implemented in any convenient manner using digital or analog circuitry, and suitable implementations will be readily apparent to those skilled in the art. The read measurement circuit 20 is shown connected to a PCM cell 10, represented as a variable resistance in the figure, for a read operation. At the start of the read operation, counter 21 initiates a time count, incrementing the count in response to periodic timing signals from controller 5 of the read/write apparatus. The count is supplied to DAC 22 whereby the voltage at the output of the DAC increases in fixed steps as the time count is successively incremented. This voltage is smoothed by voltage regulator 23 and applied as a bias voltage Vread to the bit line of PCM cell 10. The effect of components 21 to 23 is thus to generate a predetermined read voltage which increases over a range of voltage levels as the time count is successively incremented. In this embodiment, the read voltage increases monotonically, as a linear function of time, as illustrated schematically in FIG. 6 (where the step-function is represented by a straight line for simplicity).

The current flowing through cell 10 during application of the read voltage is measured by current detector 24. The detected current level I is output by detector 24 to one input of comparator 25. Comparator 25 compares the current level I with a predetermined current threshold $I_D$. If $I \geq I_D$ the comparator outputs a control signal to timer 21 which terminates the time count, whereupon application of the read voltage ceases. The count value on termination of the time count provides a direct measure of the time taken for the cell current to reach the threshold $I_D$. This count value is supplied as a time metric $T_M$ to controller 5 of device 1, and the cell measurement is complete.

Figure 7A:
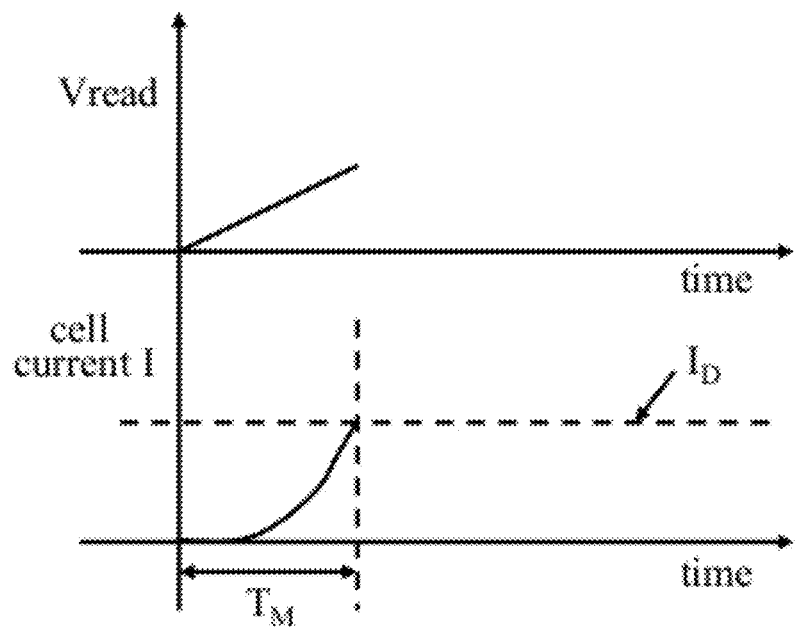
FIG. 7a illustrates a current thresholding technique used in the read measurement circuit to generate a time metric for cell-state.
Figure 7B:
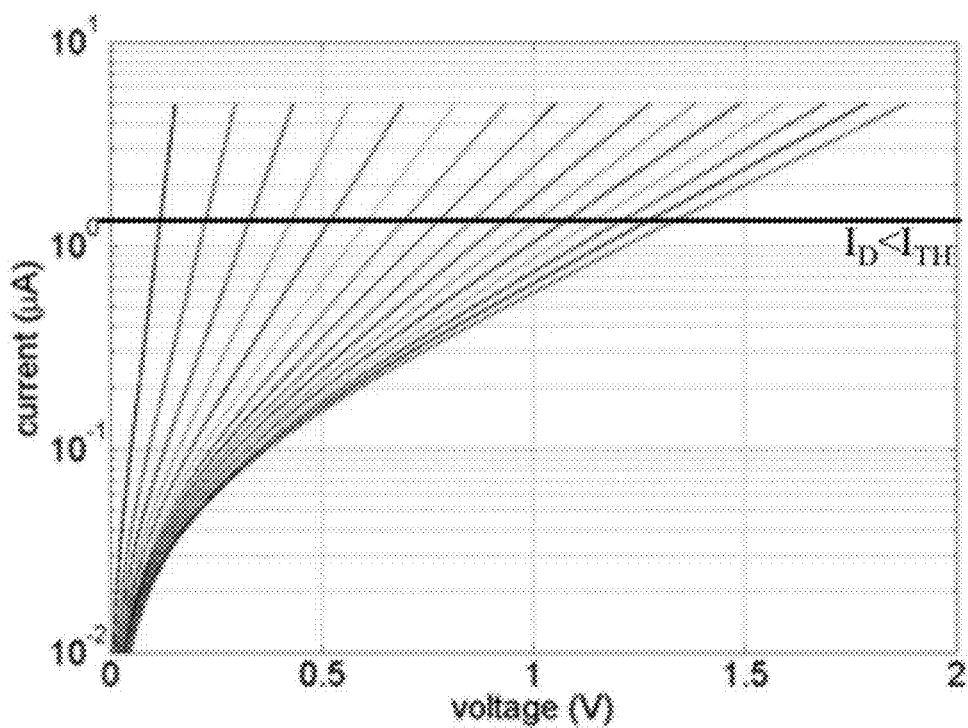
FIG. 7b further illustrates a current thresholding technique used in the read measurement circuit to generate a time metric for cell-state FIG. 8 compares cell programming curves obtained with the time metric and the conventional low-field resistance metric.

FIGS. 7a and 7b illustrate operation of this embodiment in more detail. FIG. 7a indicates how cell current varies with time up to current threshold $I_D$ during read voltage application. In this first embodiment of the invention, the current threshold $I_D$ is set to a constant value which is selected to be less than the threshold switching current $I_{TH}$ for all cell states. FIG. 7b indicates this current threshold $I_D$ for the simulated I/V curves for 16-level cells shown in FIG. 1. Since read voltage is linear with time in this embodiment, the voltage scale in FIG. 7b is analogous to time and the voltage at which each curve reaches current threshold $I_D$ is a direct analog of the time metric $T_M$ measured by circuit 20. One aspect of the superiority of the time metric $T_M$ to the resistance metric of FIG. 1 is readily apparent from this figure. All cell levels are well separated in time at the threshold $I_D$, so even the high-$u_a$ cell states can be accurately distinguished with the metric $T_M$. Whereas geometric effects cause the resistance metric to saturate at high amorphous thicknesses, the time metric continues to provide effective level discrimination for high-$u_a$ states.

Determination of cell state is performed by controller 5 of memory device 1. Following the read measurement for a cell, the metric $T_M$ output by measurement circuit 20 is supplied to controller 5 as described above. In this simple embodiment, the metric $T_M$ is used directly by controller 5 to detect the programmed cell level. Level detection can be performed in controller 5 simply by comparing the metric $T_M$ with a plurality of predetermined reference values. The reference values can correspond, for example, to pre-calculated metric values defining the different cell levels, or threshold values defining the boundaries between respective ranges of metric values which are deemed to map to the different cell levels. Comparison of the calculated metric with the reference values in controller 5 thus yields the stored cell-level. The resulting readback data is then output by controller 5 for further read-processing in order to recover the user data as discussed above.

Figure 8:
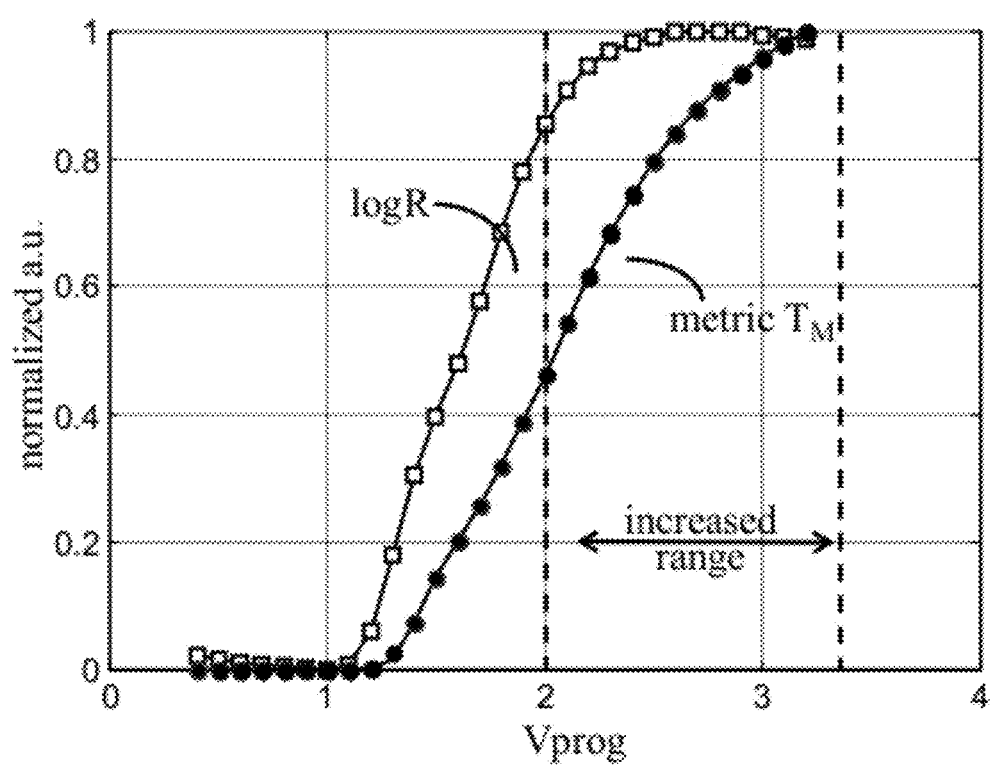
Figure 9B:
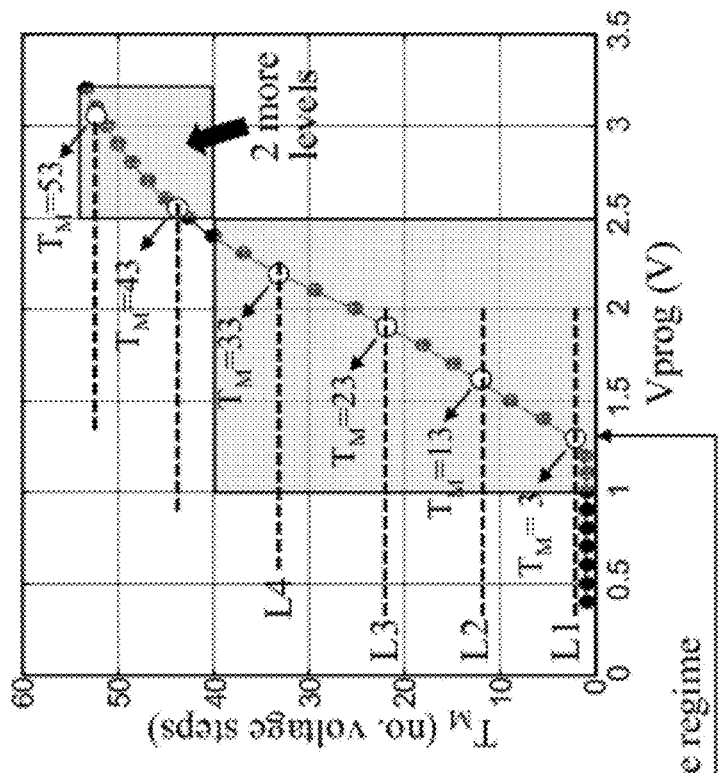
FIG. 9b further illustrates programming curves for the same cell-state regime with the resistance metric and time metric respectively.
Figure 9A:
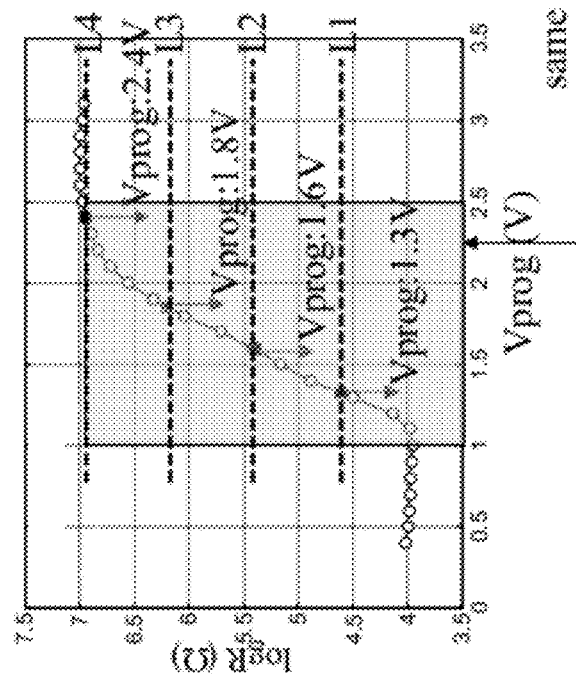
FIG. 9a illustrates programming curves for the same cell-state regime with the resistance metric and time metric respectively.

As a metric for cell-state, the metric $T_M$ has very considerable advantages over the conventional low-field resistance metric. As already illustrated by FIG. 7b, the geometric effects which limit performance of the resistance metric do not significantly impact the metric $T_M$. The metric $T_M$ can therefore effectively capture high-$u_a$ cell states. The technique described also allows the metric $T_M$ to probe the high-field region without danger of disturbing cell-state (level-switching). As a consequence of these features, the usable programming space can be significantly enhanced when the metric $T_M$ is used to determine cell-state. This is apparent from FIG. 8 which compares average programming curves measured with the resistance metric (logR) and the metric $T_M$ normalized to the same effective window. The ordinate axis here indicates normalized average units (a.u.). In the high-field region above $V_{prog}=2V$, the LogR measurements saturate while the time metric curve continues to display strong linearity and good level discrimination. This provides a substantial increase in the programming range available with the metric $T_M$. This is further demonstrated in FIGS. 9a and 9b. FIG. 9a shows the programming curve for four-level PCM cells using the resistance metric to measure the programmed state. FIG. 9b shows the equivalent curve using the metric $T_M$ in the same cell-state regime. The ordinate axis here indicates $T_M$ in terms of the count value (number of voltage steps) obtained in the FIG. 5 circuit described above. The four cell levels are indicated at L1 to L4 in the figures. FIG. 9b shows that the metric $T_M$ provides two more usable programmable levels than the resistance metric in this scenario.

Analysis of the PCM cell using a Poole-Frenkel type conduction model demonstrates further advantages of the metric $T_M$. Assuming that a layer of a-GST is sandwiched between two circular electrodes of radius r, then the current that flows though the GST layer is given by:

$$I = 2q \frac{\pi r^2}{\tau} \frac{1}{\Delta z^2} e^{-\frac{E_c - E_f}{kT}} \sinh\left[\frac{q \Delta z V}{2kT u_a}\right] \qquad (1)$$

where q is the elementary charge, $\tau_0$ is the characteristic attempt to escape time for a trapped electron, $\Delta z$ is the mean inter-trap distance, k is the Boltzmann constant and T is the temperature. $E_c - E_f$ is the activation energy. Applying this model to the cell geometry of FIG. 4 using an effective amorphous thickness $u_{aeff}$ and effective radius $r_{eff}$, the low field resistance can be expressed as:

$$R = \frac{kT u_{aeff} \tau_0 \Delta z e^{-\frac{E_c - E_f}{kT}}}{q^2 \pi r_{eff}^2} \qquad (2)$$

In contrast, the time metric $T_M$ of the above embodiment can be expressed as:

$$T_M = \frac{2kTu_{aeff}}{q\Delta z k_{slope}} \sinh^{-1}\left[\frac{I_D \tau_0 \Delta z^2 e^{-\frac{E_c-E_f}{kT}}}{2q\pi r_{eff}}\right] \quad (3)$$

where $k_{slope}$ is the slope of the read voltage ramp. It can be seen from equation (2) that the resistance metric is a strong function of the activation energy of the cell. The activation energy is strongly influenced by the defect density and physical attributes like compressive and tensile stress. Drift behaviour commonly observed in the resistance metric, and low frequency fluctuations, are attributed to similar variations in activation energy. However, it can be seen that these undesirable attributes are not related to the fundamental programmed entity which is the amorphous size and the corresponding effective amorphous thickness. As indicated by equation (3), the metric $T_M$ is a strong function of the effective amorphous thickness but is less dependent on the activation energy. Whereas the resistance metric is proportional to the activation energy term in equation (2), this term only appears in the 1/sin h term in equation (3) for the metric $T_M$. This indicates a significant reduction in impact of drift and low frequency noise on the metric $T_M$.

Figure 10:
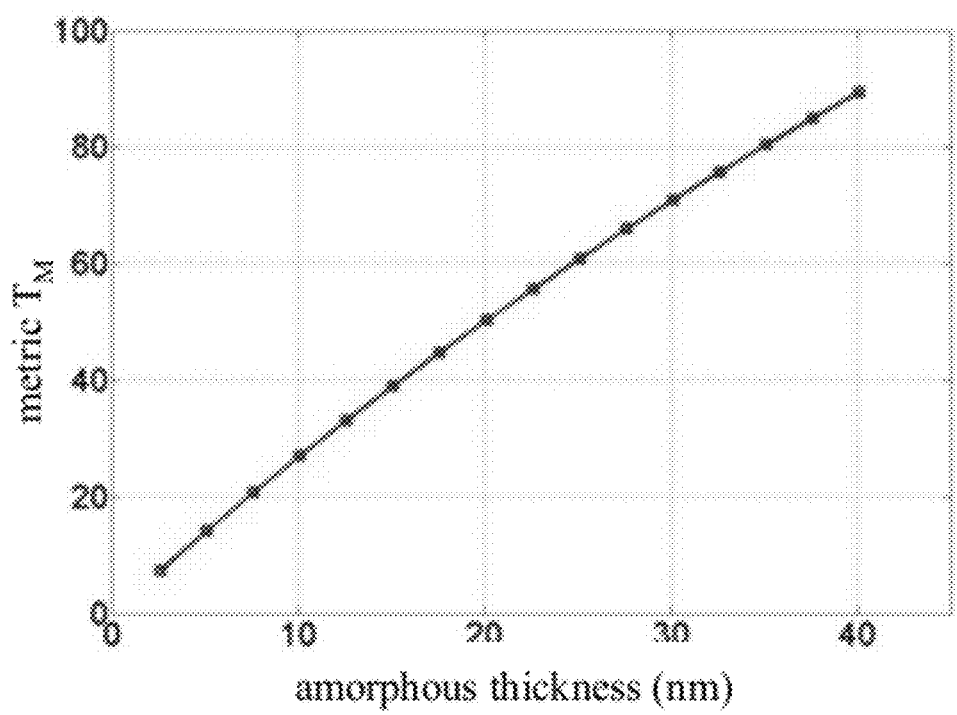
FIG. 10 shows the time metric as a function of amorphous thickness.

Equation (3) also indicates that the time metric is a strong function of the effective amorphous thickness but only a weak function of the effective contact radius $r_{eff}$. This indicates that the time metric should not saturate at high values of amorphous thickness as already discussed above. This is further confirmed by the plot of $T_M$ against amorphous thickness obtained from simulation results in FIG. 10. This shows strong linearity of $T_M$ with amorphous thickness and good level discrimination across the range.

A still further advantage over the resistance metric is that the metric $T_M$ is directly measured and so there is no 1/x compression. Overall, therefore, it will be seen that the metric $T_M$ provides an improved metric for amorphous size and hence cell-state.

While a simple embodiment has been described above, various alternative embodiments can be envisaged. By way of example, some alternative methods for deriving a time-based metric will be described below with reference to FIGS. 11a to 14.

Figure 11A:
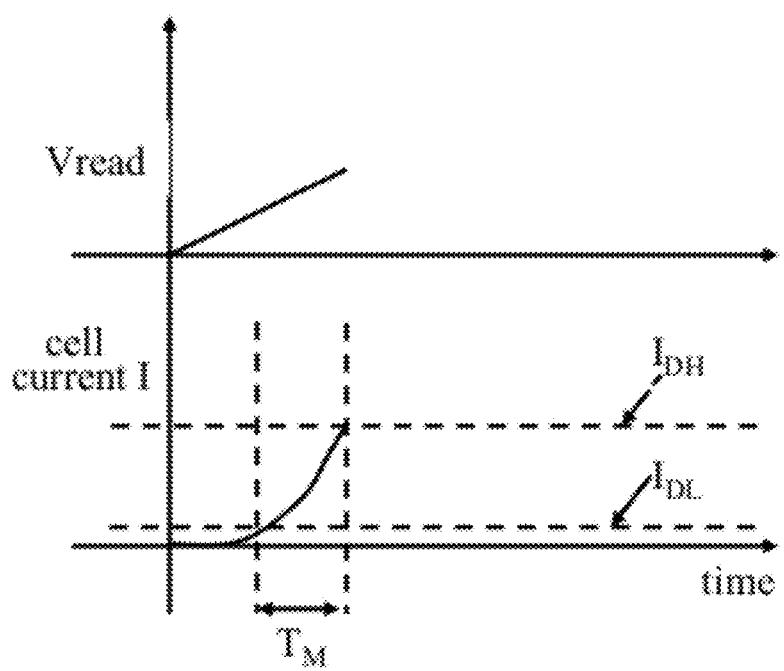
FIG. 11a illustrates a technique for generating a time metric in embodiments of the present invention.
Figure 11B:
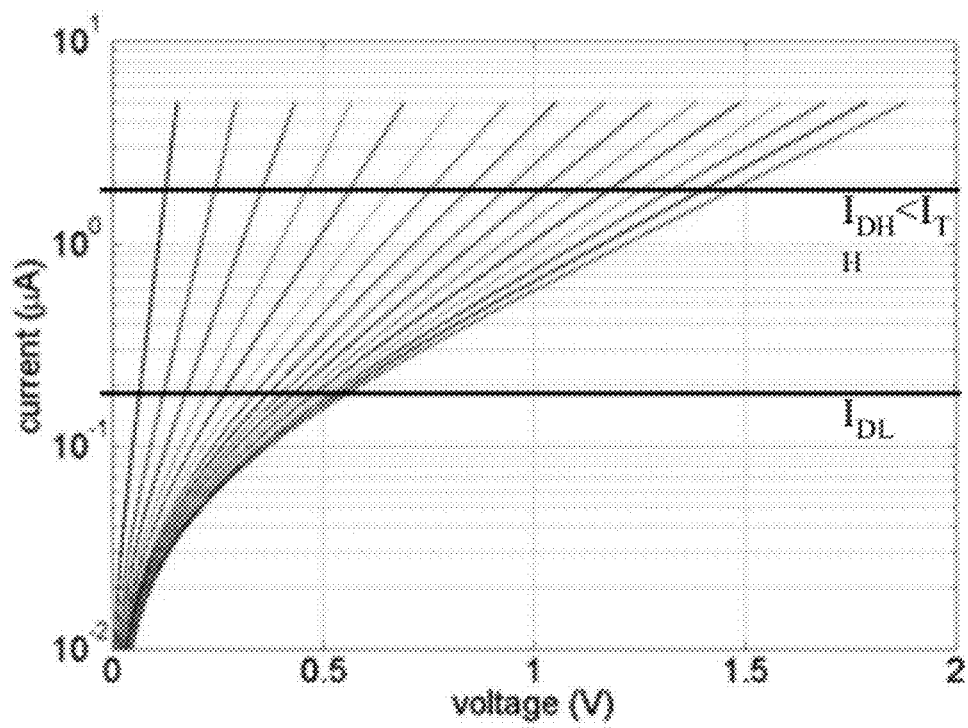
FIG. 11b illustrates another technique for generating a time metric in embodiments of the present invention.

FIGS. 11a and 11b illustrate a first alternative method using figures of similar form to FIGS. 7a and 7b. Here, the condition to be satisfied by the cell current on making the time measurement is different to that of the first embodiment. The condition here is that the cell current I changes from a first, lower current level $I_{D1}$ to a second, higher current level $I_{D2}$. The time for the cell current to increase from the lower to the higher threshold is measured as the metric $T_M$. Analysis based on Equation (3) above indicates that this "time difference metric" can exhibit even greater tolerance to drift and low frequency noise.

Figure 12:
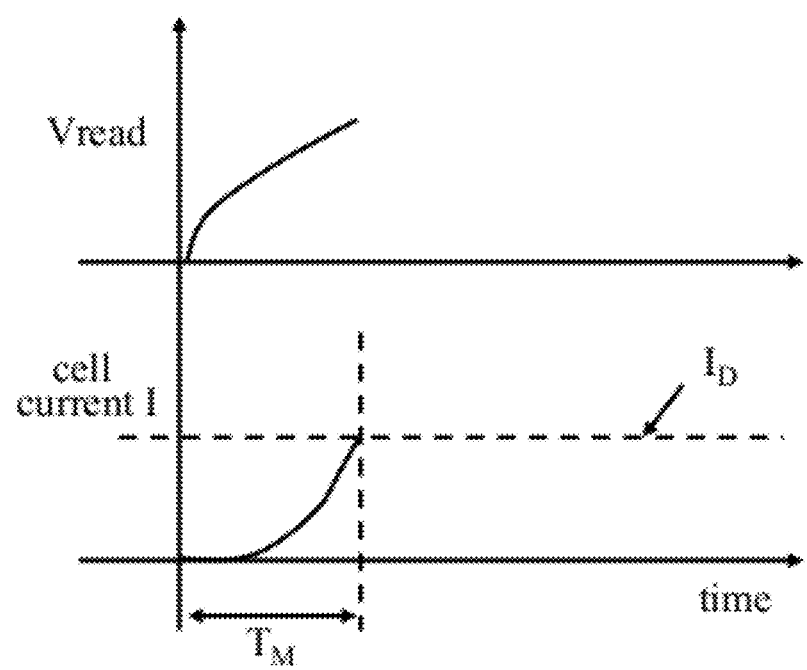
FIG. 12 illustrates a modification to the time metric generation technique of FIGS. 7a and 7b.

FIG. 12 illustrates a modification to the FIG. 7a technique in which the bias voltage $V_{read}$ is a non-linear function of time. This can be desirable for a number of reasons. For example, the voltage ramp can be tailored to correct for the hyperbolic sine behavior which causes deviation of the time metric from exponential form at low voltages. Non-linearity can also be used to increase the read bandwidth and/or increase margin of the metric. In general, the time dependence of the read voltage can be altered in various ways to achieve desired effects in different embodiments.

The current thresholds used in the foregoing embodiments are independent of the read voltage $V_{read}$. Alternative embodiments can use current thresholds which are functions of the read voltage. For example, where the time measurement depends on the current I increasing to a predetermined current level, in the limiting case the predetermined current level can be the threshold switching current. This varies with level, tending to be higher at low levels of amorphous thickness. In this case, the read voltage can be increased until the cell current reaches the switching threshold for the level in question, and the measurement circuit can record the time at which the cell switches. However, it can then be necessary to restore the original cell state. Randomness in the switching threshold can also limit accuracy in this case. In general, therefore, it can be preferred that any current threshold is defined so as to avoid level switching. In some embodiments, this can be done by ensuring that the threshold level at any read voltage level is less than the threshold switching current for all cell states. In other embodiments, however, the threshold can vary with read voltage so as to stay under potential switching thresholds attainable at any given voltage level but not necessarily under switching thresholds for all states, in particular those which switch at higher voltage levels. In these embodiments, at any read voltage level, the threshold current level should be less than the threshold switching current for any cell states having a threshold switching voltage up to that read voltage level.

Figure 13A:
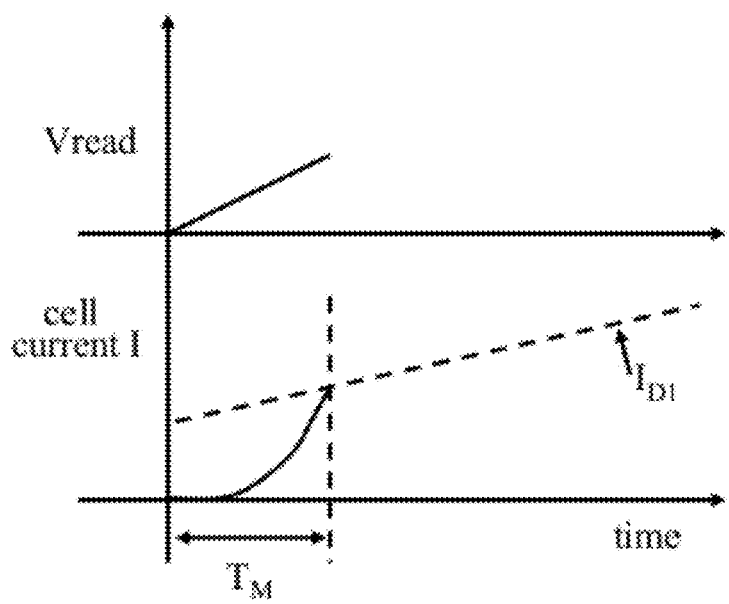
FIG. 13a illustrates a possible modification to the time metric generation technique.
Figure 13B:
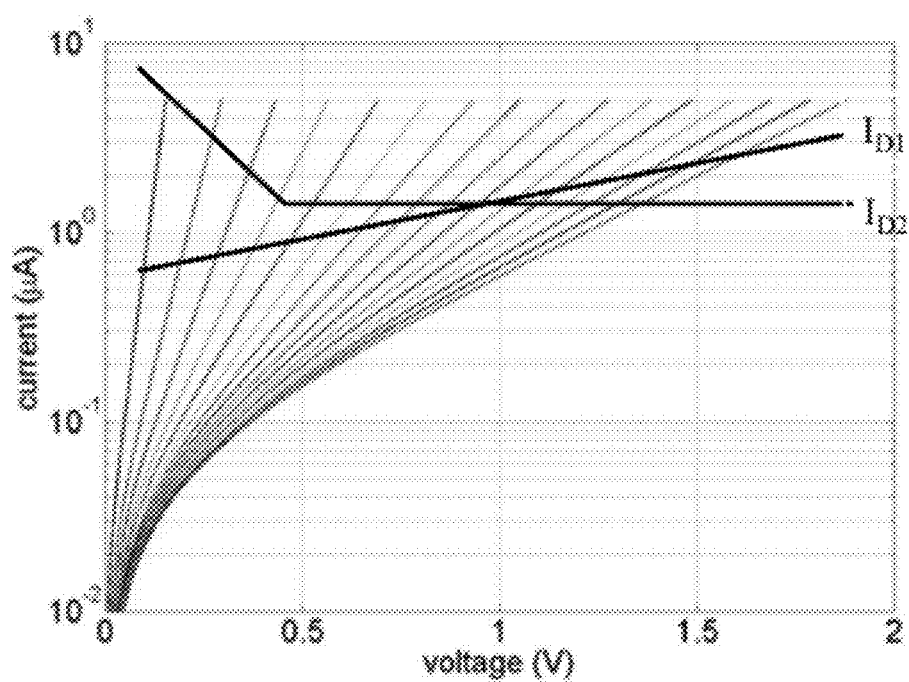
FIG. 13b illustrates another possible modification to the time metric generation technique

FIGS. 13a and 13b illustrate two examples of current thresholds which are functions of the read voltage. With threshold $I_{D1}$, the current threshold is higher at high voltages to increase the signal-to-noise ratio (SNR) in the high-field regime. With threshold $I_{D2}$, the current threshold is higher at low voltages to increase resolution in the low-field regime. (This threshold illustrates how the threshold level at a given read voltage level can be higher than the threshold switching current for cell states having threshold switching voltages above that read voltage level). At low levels of amorphous thickness it is experimentally observed that the threshold switching current is significantly higher. Hence an increased current threshold $I_{D2}$ at low voltage levels can be employed to enhance the SNR. At higher voltage levels, $I_{D2}$ is still low enough to avoid switching of levels corresponding to high amorphous thickness.

Figure 14:
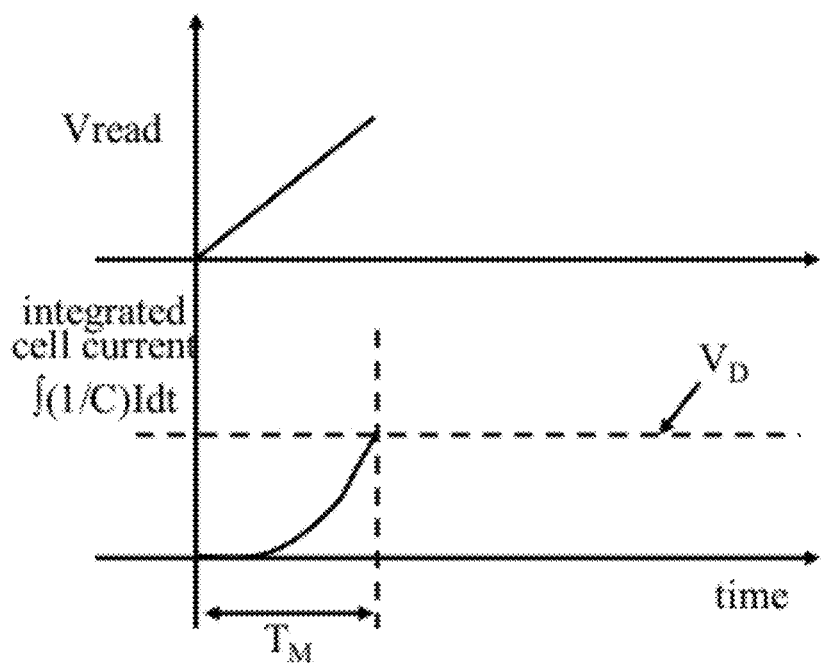
FIG. 14 illustrates a further technique for generating a time metric in embodiments of the invention.

FIG. 14 illustrates an alternative embodiment in which the condition to be satisfied for the time measurement is that a parameter dependent on an integral of the cell current reaches a predetermined level. In this example, the metric $T_M$ corresponds to the time taken for the cell current to charge a capacitor (capacitance=C) to a predetermined voltage level $V_D$. Again this threshold level can be set appropriately to avoid threshold switching. Here a constant threshold voltage level $V_D$ is used although the threshold can be made dependent on read voltage if desired. Other parameters dependent on the cell current can also be monitored in other embodiments.

While the time measurement $T_M$ is used directly as the metric for discriminating levels above, if desired the time measurement can be subjected to further processing (e.g. based on additional corrective techniques) to derive the final cell-state metric. In addition, in some cases another parameter indicative of time can be measured, e.g. read voltage level in some embodiments. Also, although it is preferred that the predetermined read voltage is a monotonically increasing function as in the embodiments described, alternatives can be envisaged in which the voltage increases generally, though not monotonically, or even decreases with time. For example, an embodiment can be envisaged using a time difference metric similar to FIG. 11a in which the read voltage is ramped down from a predetermined (sub-switching threshold) level and the cell current decreases from a higher to a lower threshold.

In the embodiments described above, the read voltage scan is stopped when the time measurement is taken. While this can be preferred for the reasons already discussed, it need not necessarily be so. For example, if the read voltage is always scanned through the entire voltage range, regardless of measurement completion, a cell whose state is then altered after detection can be immediately re-programmed. Our European patent application filed concurrently herewith under Applicant's reference CH9-2010-0093 (the content of which is incorporated herein by reference) discloses a technique exploiting methods of this type for use in programming cell states.

In the preferred embodiments detailed above, the read voltage varies with time in a predetermined manner and the cell-state metric is based on a measurement of the time taken for a condition dependent on cell current to be satisfied. Alternative embodiments can be envisaged however. In particular, embodiments of the present invention can be envisaged in which the read voltage does not vary with time in a predetermined manner. For example, the read voltage can be varied in a substantially random manner until the current-dependent condition is determined to be satisfied. As an alternative to such a "random search" procedure, a (possibly arbitrary) read voltage level can be selected as a starting point, and this level can then be varied according to some predefined algorithm until the current-dependent condition is determined to be satisfied. A particular example here can be to vary the read voltage in a feedback manner. The subsequent read voltage levels can be determined based on cell current. The read voltage level can thus be caused gradually to converge on the particular level at which the current-dependent condition is satisfied. In embodiments such as this where the variation of the read voltage with time is not predetermined, the measurement used as a metric for cell-state can be a measurement which is (directly or indirectly) indicative of the read voltage level at which the current-dependent condition is satisfied. Such a metric is superior to the conventional resistance metric for equivalent reasons to those discussed above in connection with the time metric.

Various combinations of the foregoing embodiments can also be envisaged. Suitable modifications to the measurement circuitry to implement the various embodiments will be readily apparent to those skilled in the art.

Other changes and modifications can be made to the specific embodiments described without departing from the scope of the invention.

What is claimed is:

1. A method of determining the state of a phase-change memory cell, the method comprising the steps of:
    biasing a cell with a time-varying read voltage ($V_{read}$);
    making a time measurement ($T_M$) that satisfies one of a plurality of predetermined conditions, wherein said predetermined conditions depend on a cell current when said read voltage is applied; and
    determining a state of the cell based on said time measurement.

2. The method according to claim 1, wherein said measurement indicates a read voltage level at which said predetermined condition is satisfied.

3. The method according to claim 1, further comprising the step of:
    biasing said cell with a predetermined read voltage ($V_{read}$) that varies with time over a range of voltage levels,
    wherein said measurement ($T_M$) indicates time taken to satisfy said predetermined condition.

4. The method according to claim 3, wherein said read voltage ($V_{read}$) increases with time.

5. The method according to claim 3, wherein said read voltage ($V_{read}$) is a linear function of time.

6. The method according to claim 3, wherein said read voltage ($V_{read}$) is a non-linear function of time.

7. The method according to claim 1, wherein said predetermined condition comprises a condition in which said cell current reaches a predetermined current level ($I_D$, $I_{D1}$, $I_{D2}$).

8. The method according to claim 3, wherein said predetermined condition comprises a condition in which said cell current changes from a first predetermined current level ($I_{DL}$) to a second predetermined current level ($I_{DH}$).

9. The method according to claim 7, wherein said predetermined current level ($I_D$, $I_{D1}$, $I_{D2}$, $I_{DL}$, $I_{DH}$) is independent of said read voltage ($V_{read}$).

10. The method according to claim 7, wherein said predetermined current level ($I_D$, $I_{D1}$, $I_{D2}$, $I_{DL}$, $I_{DH}$) is less than a threshold switching current for all said states of a cell.

11. The method according to claim 3, wherein:
    said predetermined condition comprises a condition in which said cell current reaches a predetermined current level ($I_D$, $I_{D1}$, $I_{D2}$); and
    said predetermined current level ($I_D$, $I_{D1}$, $I_{D2}$, $I_{DL}$, $I_{DH}$) is: (i) a function of said read voltage ($V_{read}$); and (ii) at any read voltage level, a current level that is less than a threshold switching current for any cell states having a threshold switching voltage up to said read voltage level.

12. The method according to claim 1, further comprising the step of:
    ceasing application of said read voltage ($V_{read}$) when said predetermined condition is satisfied.

13. The method according to claim 1, wherein said method determines a state of an s-level phase-change memory cell in which s is greater than 2, the method further comprising the step of:
    comparing a metric dependent on said measurement ($T_M$) with a plurality of reference values indicative of s levels of said cell.

14. A method of determining the state of a phase-change memory cell, the method comprising the steps of:
    biasing a cell with a time-varying read voltage ($V_{read}$);
    making a measurement ($T_M$) that satisfies a predetermined condition, wherein said predetermined condition depends on a cell current when said read voltage is applied and comprises a condition in which a parameter depending on an integral of said cell current reaches a predetermined level ($V_D$); and
    determining a state of the cell based on said measurement.

15. A method of determining the state of a phase-change memory cell, the method comprising the steps of:
    biasing a cell with a predetermined read voltage ($V_{read}$) that varies over time over a range of voltage levels;
    making a measurement of time ($T_M$) to satisfy a predetermined condition in which said a cell current reaches a predetermined level ($I_D$, $I_{D1}$, $I_{D2}$) and said predetermined current level ($I_D$, $I_{D1}$, $I_{D2}$, $I_{DL}$, $I_{DH}$) is a function of said read voltage ($V_{read}$); and
    determining a state of the cell based on said time measurement.

* * * * *